(12) United States Patent
Bunin et al.

(10) Patent No.: US 8,816,395 B2
(45) Date of Patent: Aug. 26, 2014

(54) FIELD EFFECT POWER TRANSISTORS

(75) Inventors: Gregory Bunin, Ashdod (IL); Tamara Baksht, Tel Aviv (IL); David Rozman, Ashdod (IL)

(73) Assignee: Visic Technologies Ltd., Rehovot (IL)

(*) Notice: Subject to any disclaimer, the term of this patent is extended or adjusted under 35 U.S.C. 154(b) by 321 days.

(21) Appl. No.: 13/215,254

(22) Filed: Aug. 23, 2011

(65) Prior Publication Data

US 2011/0297961 A1 Dec. 8, 2011

Related U.S. Application Data

(63) Continuation-in-part of application No. PCT/IB2011/051939, filed on May 2, 2011.

(60) Provisional application No. 61/330,361, filed on May 2, 2010.

(51) Int. Cl.
H01L 29/66 (2006.01)

(52) U.S. Cl.
USPC .................................. 257/194; 257/E29.246

(58) Field of Classification Search
USPC ........ 257/13, 48, 76, 194, E29.246–E29.248, 257/E29.09, E29.091, E29.089, 192, 189, 257/E29.252, E29.255
See application file for complete search history.

(56) References Cited

U.S. PATENT DOCUMENTS

| | | | |
|---|---|---|---|
| 6,025,612 A * | 2/2000 | Hida | 257/192 |
| 7,655,962 B2 | 2/2010 | Simin et al. | |
| 8,178,899 B2 * | 5/2012 | Matsushita | 257/192 |
| 8,304,811 B2 * | 11/2012 | Zhang | 257/194 |
| 2005/0263791 A1 * | 12/2005 | Yanagihara et al. | 257/194 |
| 2007/0278518 A1 * | 12/2007 | Chen et al. | 257/192 |
| 2008/0237606 A1 * | 10/2008 | Kikkawa et al. | 257/76 |
| 2009/0072269 A1 | 3/2009 | Suh et al. | |
| 2009/0146185 A1 | 6/2009 | Suh et al. | |
| 2009/0166678 A1 | 7/2009 | Sato et al. | |
| 2009/0189187 A1 * | 7/2009 | Briere et al. | 257/192 |
| 2010/0025730 A1 | 2/2010 | Heikman et al. | |
| 2010/0084688 A1 | 4/2010 | Lu et al. | |
| 2010/0127275 A1 * | 5/2010 | Takehiko et al. | 257/76 |
| 2010/0155720 A1 * | 6/2010 | Kaneko | 257/43 |
| 2011/0121313 A1 * | 5/2011 | Briere | 257/76 |
| 2012/0168822 A1 * | 7/2012 | Matsushita | 257/194 |

FOREIGN PATENT DOCUMENTS

WO 2009119357 10/2009

OTHER PUBLICATIONS

Xing H. et al., Gallium nitride based transistors, J.Phys.:Condens. Matter 13 (2001) 7139-7157.
Koleske D.D. et al., Understanding Gallium Nitride Nucleation Layer Evolution, Wide Bandgap Compound Semiconductor Science, pp. 18-19, (Aug. 2008).

(Continued)

Primary Examiner — Daniel Luke
Assistant Examiner — Latanya N Crawford
(74) Attorney, Agent, or Firm — A.C. Entis-IP Ltd.

(57) ABSTRACT

A normally OFF field effect transistor (FET) having a plurality of contiguous nitride semiconductor layers having different composition and heterojunction interfaces, wherein when there is no potential difference between a first gate and a common ground voltage, a two dimensional electron gas (2DEG) is present at a plurality of heterojunctions in each of a source access region and a drain access region, and substantially no 2DEG is present adjacent any regions of the heterojunctions under the first gate.

20 Claims, 13 Drawing Sheets

(56) References Cited

OTHER PUBLICATIONS

S Pal, et al., Silicon—new substrate for GaN growth, Bull.Mater.Sci., vol. 27, No. 6, (Dec. 2004), pp. 501-504.

Nemati H.M., et al., Evaluation of a GaN HEMT Transistor for Load- and Supply- Modulation Applications Using Intrinsic Waveform Measurements, in IEEE Microw.Theory Tech.Soc. (MTT-S) IMS (May 23-28, 2010) pp. 509-512.

Dr. Ume et al., Introduction to Transistors and common application in mechatronics, Presentation, ME 6405, pp. 1-15, Sep. 2012.

Introduction to Transistors, Kilowatt Classroom, LLC (2003) pp. 1-6.

RF power transistors: comparative study of LDMOS versus bipolar technology, ST Microelectronics, Application Note 1223 (Oct. 2007) pp. 1-6.

Rokn-Abadi, GaN/SiC heterostructure field-effect transistor model including polarization effects, Int.J.Phys.Sci. vol. 5 (11), Sep. 2010, pp. 1728-1733.

International Partial Search Report PCT/IB2011/051939 dated Aug. 3, 2011.

Masafumi I., et al., Normally-off AlGaN/GaN HEMTs with Thin InGaN Cap Layer,IEICE Trans. Electron., vol. E91-C, No. 7, Jul. 2008, pp. 989-993.

Mizutani T., et. al., AlGaN/GaN HEMTs with Thin InGaN Cap Layer for Normally Off Operation, IEEE Electron Device. Letters, vol. 28, No. 7, Jul. 2007, pp. 549-551.

* cited by examiner

FIELD EFFECT POWER TRANSISTORS

RELATED APPLICATIONS

The present application is a Continuation in Part of PCT Application No. PCT/IB2011/051939, filed on May 2, 2011, which claims the benefit under 35 U.S.C. 119(e) of U.S. Provisional Application 61/330,361 filed on May 2, 2010, the disclosure of which is incorporated herein by reference.

TECHNICAL FIELD

Embodiments of the invention relate to field effect transistors.

BACKGROUND

Various products and systems, including consumer products such as TVs, electric powered vehicles, radar systems, electric motor controllers and uninterrupted power supply (UPS) systems, require provision of relatively large amounts of electric power often provided from a high voltage power supply. Various types of semiconductor field effect transistors (FETs) based on silicon materials and technology are generally used as power switches to perform switching functions required by the products and systems.

A FET typically comprises terminals referred to as a "source" and a "drain" for connecting a power source to a load and a terminal in the FET located between the source and drain referred to as a "gate" for controlling resistance of a current carrying channel in the FET located under the gate between the source and drain. Voltage relative to a common ground voltage applied to the gate generates an electric field in the FET that controls the resistance of the channel to turn the transistor ON and OFF. When turned ON, voltage applied the gate reduces the resistance of the channel to allow relatively large current flow between the source and drain. Total resistance between the source and drain when the transistor is turned ON is referred to as an "ON resistance" of the transistor. The ON resistance depends upon the resistance of the channel, resistance to current flow of a region of the FET under, and in the neighborhood, of the source, and resistance of a region of the FET under, and in the neighborhood, of the drain. The regions under and in the neighborhoods of the source and drain are conventionally referred to as access regions.

Whereas conventional power FETs based on Si provide useful switching functions, they are not readily configured to provide desired characteristics for power switching applications for, by way of example, operation of devices such as, electric motors and vehicles, uninterruptible power supplies (UPS) and photovoltaic inverters. Switches suitable for operation of these devices are advantageously characterized by relatively high breakdown voltage when they are OFF, high "ON currents" between source and drain when they are ON, and relatively low gate and drain leakage currents. It is advantageous that they are capable of operating at high junction temperatures and that they exhibit good tolerance to current and/or voltage transients that tend to occur during switching between OFF and ON states. In addition, for safety reasons, preferably the switches are OFF when their gates are at ground potential.

For example, it can be advantageous for a semiconductor power switch to have a breakdown voltage equal to or greater than about 600 V and drain leakage currents less than about 100 μA per mm (millimeter) of gate periphery when OFF. When ON it is advantageous that the switch, have an ON resistance less than or about equal to 10 Ohm per mm and be capable of safely supporting a drain current greater than or equal to about 50 A (amps). In addition, for safety reasons, it is generally advantageous that the switch be OFF for gate voltages less than about 2 volts, and be able to operate without damage to itself at junction temperatures greater than or equal to about 200° C. Semiconductor switches based on Si materials and technology are generally not readily configurable to provide these specifications because their band gaps, which are typically less than about 2 eV (electron volts), and saturation drift velocities of electrons in the materials do not naturally support high breakdown voltages and large ON current.

Nitride based semiconductor materials, such as GaN (Gallium Nitride) and AlN (Aluminum Nitride) on the other hand, are characterized by relatively large band gaps of 3.4 eV and 6.2 eV respectively. And FETs having a nitride semiconductor layer structure comprising a small band gap layer adjacent a large band gap layer provide a relatively high concentration of high mobility electrons characterized by a high saturation drift velocity. The high mobility electrons accumulate in a narrow triangular potential well at an interface between the layers to form a relatively thin, sheet-like electron concentration, referred to as two dimensional electron gas (2DEG). Because of the geometrical construction and location of the 2DEG, electrons in the 2DEG generally evidence very low donor impurity scattering, and as a result, the relatively high electron mobility, which may for example be equal to about $1.5 \times 10^7$ cm/s. Concentrations of electrons in a 2DEG may be as high as $1 \times 10^{13}/cm^2$.

FET transistors that operate by generating and controlling high mobility electrons in 2DEGs are conventionally referred to as high electron mobility transistors "HEMTs". Semiconductor layer structures comprising layers of different composition that characterize these transistors are referred to as "heterostructures", and interfaces between two adjacent layers of different composition are referred to as "heterojunctions".

Whereas the inherent characteristics of nitride based semiconductor materials appear to make them excellent materials for use in producing high power semiconductor switches, it has proven difficult to exploit the characteristics to provide such switches. For example, 2DEG nitride FETs are normally ON, rather than being the desired, normally OFF, and it has been found difficult to produce nitride semiconductor layers having defect concentrations sufficiently low to produce power FETs having desired characteristics at acceptable costs.

SUMMARY

An embodiment of the invention relates to providing a FET comprising a plurality of nitride semiconductor layers for which piezoelectric and spontaneous polarization of the layers are configured so that the FET is normally OFF and has a relatively large breakdown voltage, and when ON, has relatively small resistance to current flow between a source and drain of the transistor.

In an embodiment of the invention, the layers in the FET comprise a 2DEG current channel located in a relatively narrow band gap nitride "channel" layer, in a neighborhood of a heterojunction between the channel layer and a relatively wide band gap nitride layer. The wide band gap layer functions as an "electron supply", layer, which provides electrons to the channel layer. The channel and electron supply layers are associated with a third nitride layer, referred to as a "potential modifying layer". In an embodiment of the invention, an electric field generated by piezoelectric and/or spontaneous polarization of the potential modifying layer has a direction opposite to that in the electron supply layer. The electric field of the potential modifying layer modifies an electrostatic potential generated by electrostatic fields resulting from polarization of the channel and electron supply layers to substantially depopulate the 2DEG channel in the first current channel of electrons so that the FET is normally OFF.

In an embodiment of the invention, the channel and electron supply layers associated with the first 2DEG channel are formed from GaN and $In_yAl_zGa_{1-y-z}N$ respectively. The potential modifying layer is formed optionally from $In_xGa_{1-x}N$. To mitigate impurity scattering that reduces electron mobility, optionally, the semiconductor materials in the channel and electron supply layers in the FET are not intentionally doped.

In accordance with an embodiment of the invention, the FET comprises additional 2DEG current channels at heterojunctions of other nitride layers that have 2DEGs in access regions of the FET. The additional 2DEG channels and electrons in the access regions enable establishment of a relatively small resistance current path between the source and drain when the FET is turned ON.

A plurality of gates are located between the source and drain, and voltages applied to the gates are used to shape fields in the FET that control currents and electron concentrations in the 2DEG current channels. Optionally, the FET is formed having a recess or recesses that have bottom surfaces at different depths below a top layer of the FET. Different gates of the plurality of gates are located on different bottom surfaces of the recess or recesses.

In an embodiment of the invention, to turn the FET ON voltages that decrease monotonically with distance of the gates from the source are applied to the gates to generate or enhance electron populations in 2DEGs in the plurality of 2DEG channel layers. Optionally, the voltages are configured to moderate current and/or voltage transients in the FET that may appear and damage the FET during transition of the FET from OFF to ON.

In an embodiment of the invention, layers in the FET comprising the channel and electron supply layers are epitaxially grown over a superlattice structure of thin semiconductor layers that is epitaxially embedded in a buffer layer and doped with compensation impurities. The superlattice structure operates to moderate propagation of dislocations, pipes and other defects from the substrate into the channel and electron supply layers that would tend to reduce electron concentration and mobility of electrons in the channel layers and enhance leakage currents in the FET. The compensation impurities provide the superlattice with increased resistance to current flow.

In an embodiment of the invention, conducting material for source and drain electrodes is deposited only on a top semiconductor surface of the FET prior to annealing to provide ohmic contact between the source and drain electrodes and current carrying, "active", channel layers of the FET. By limiting deposits of the conducting material for the electrodes to the top layer, distance between the deposits and semiconductor layers below the active layers is maximized. As a result, during annealing, diffusion of conducting material from the deposits to the layers below the active layers is moderated. Moderating diffusion of conducting material to layers below the active layers operates to reduce leakage currents.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF FIGURES

Non-limiting examples of embodiments of the invention are described below with reference to figures attached hereto that are listed following this paragraph. Identical structures, elements or parts that appear in more than one figure are generally labeled with a same numeral in all the figures in which they appear. Dimensions of components and features shown in the figures are chosen for convenience and clarity of presentation and are not necessarily shown to scale.

DETAILED DESCRIPTION

In the following paragraphs of the detailed description, structure of a power FET in accordance with an embodiment of the invention and characteristics of 2DEG concentrations in layers of the FET for OFF states are discussed with reference to FIG. 1. Methods for providing a semiconductor device, such as the FET shown in FIG. 1A, with electrodes that tend to reduce leakage currents in the device are discussed with reference to FIGS. 1B and 1C. Band diagrams for the OFF state of the FET are shown in FIG. 1D and are discussed with reference to the figures. FIG. 2A schematically shows the FET shown in FIG. 1A when the FET is ON. Band diagrams for the ON state of the FET are shown in FIG. 1D and are discussed with reference to the figures.

In the discussion unless otherwise stated, adjectives such as "substantially" and "about" modifying a condition or relationship characteristic of a feature or features of an embodiment of the invention, are understood to mean that the condition or characteristic is defined to within tolerances that are acceptable for operation of the embodiment for an application for which it is intended.

Figure 1A:
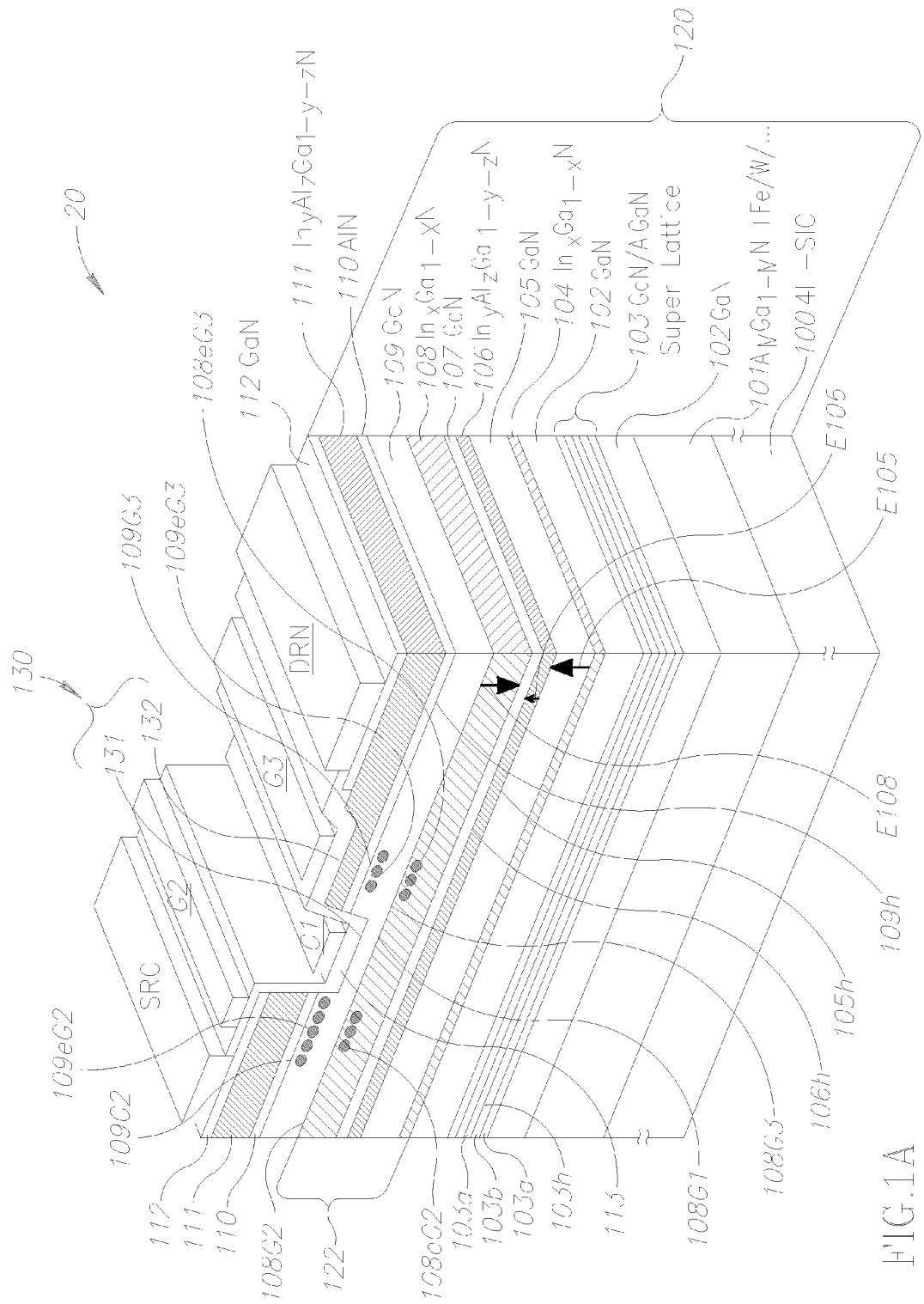
FIG. 1A schematically shows a perspective view of a normally OFF FET, optionally comprising three 2DEG channels and three gates, in an OFF state, in accordance with an embodiment of the invention.
Figure 2A:
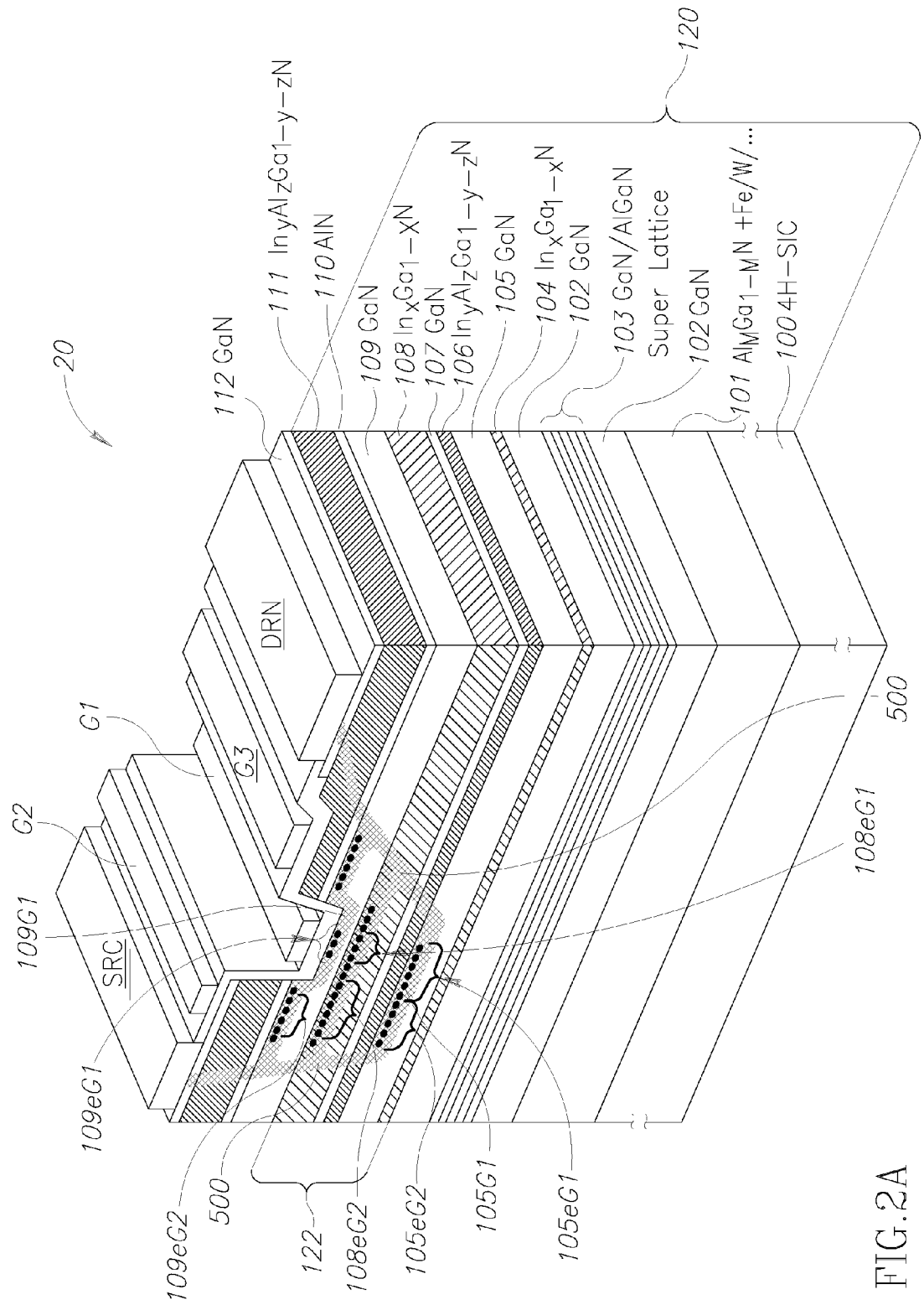
FIG. 2A schematically shows the FET shown in FIG. 1A in an ON state, in accordance with an embodiment of the invention.

FIG. 1A schematically shows a perspective view of a normally OFF, GaN FET transistor 20 comprising a drain "DRN", a source "SRC" and, optionally three gates, G1, G2 and G3 located between the source and drain, formed on a heterostructure stack 120 of epitaxially grown semiconductor layers, in accordance with an embodiment of the invention. The semiconductor layers have 2DEG current paths for conducting current between source SRC and drain DRN. Application of appropriate voltages to the gates controls the current paths to be conducting and non-conducting and the FET correspondingly ON and OFF. In FIG. 1A it is assumed that no voltages are applied to the gates and the FET is OFF.

Stack 120 comprises a bottom, optionally high resistance substrate layer 100 on which overlaying layers are epitaxially formed, optionally by a metal organic chemical vapor deposition (MOCVD) growth process. In some embodiments of the invention the layers are grown by a molecular beam epitaxy (MBE) growth process. Substrate 100 may comprise a single crystal Si, $Al_2O_3$ (Sapphire), AlN, or a single crystal polytype of SiC (silicon carbide, carborundum) such as 4H—SiC, 6H—SiC, or 3C—SiC.

A high resistance $Al_MGa_{1-M}N$ layer buffer layer 101 is grown on the substrate. Buffer layer 101 operates to reduce occurrence of threading and other dislocations in upper layers of stack 120, which may be generated by lattice mismatch between substrate 100 and the upper layers. Layer 101 is optionally doped with Fe, W, V, Cr, Ni or Mg to decrease concentration of conduction band electrons in the layer material and enhance the layer's resistance to leakage currents in the transistor that may flow through the layer. Layer 101 has a thickness between about 0.5 and about 5 µm (microns) and M between 0.0 and about 0.05.

A GaN layer 102 having embedded therein a GaN/AlGaN superlattice 103 is formed over layer 101. GaN layer 102 has thickness between about 200 nm and about 400 nm. Optionally, GaN layer 102 has thickness equal to about 300 nm. Superlattice 103 comprises a plurality of GaN layers 103a interleaved with $Al_LGa_{1-L}N$ layers 103b. In an embodiment of the invention, superlattice 103 comprises at least 10 alternating GaN/$Al_LGa_{1-L}N$ layers 103a/103b. Each layer 103a or 103b in the superlattice has thickness between about 1 nm and about 30 nm. Interfaces, that is heterojunctions, 103h between the superlattice layers 103a and 103b operate as "mechanical" barriers that moderate propagation of dislocations from layers 100 and 101 into epitaxial layers in stack 120 above layer 102. Layer 102 comprising superlattice 103 in accordance with an embodiment of the invention may be considered an additional buffer layer that reduces defect concentrations in active layers located above layer 102, which are controlled to carry current between source SRC and drain DRN. Layers 102 and 103 are optionally doped with Fe, W V, Cr, Ni or Mg to increase resistance of the layers to current flow.

An active layer set 122 of epitaxial layers comprising a normally OFF, non-conducting, 2DEG current channel is grown on layer 102. In an embodiment of the invention, active layer set 122 comprises a relatively narrow band, GaN channel layer 105 contiguous with a relatively wide band $In_yAl_zGa_{1-y-z}N$ electron supply layer 106. The 2DEG current channel is located in GaN layer 105 close to an interface, that is, a heterojunction 105h between the GaN and $In_yAl_zGa_{1-y-z}N$ layers 105 and 106.

Discontinuity between conduction and valence bands in GaN layer 105 and conduction and valence bands respectively in $In_yAl_zGa_{1-y-z}N$ layer 106, and electrostatic fields generated by piezoelectric and spontaneous polarization in the layers would normally produce a triangular potential well in the GaN layer near heterojunction 105h and populate the potential well with a 2DEG. The electrostatic fields in layers 105 and 106 are schematically represented by block arrows labeled $E_{105}$ and $E_{106}$ respectively. The 2DEG would make the current channel in GaN layer 105 conducting and able to support current flow between source SRC and drain DRN when no voltages are applied to gates G1, G2 and G3, and result in FET 20 being normally ON.

However, in accordance with an embodiment of the invention, active layer set 122 comprises a potential modifying layer 108, having an electrostatic field represented by a block arrow $E_{108}$ generated by spontaneous and/or piezoelectric polarization of the layer that has a direction opposite to the electrostatic field $E_{106}$ in electron supply layer 106. Optionally, layer 108 comprises $In_xGa_{1-x}N$. Electric field $E_{108}$ generates a potential that operates to reduce a depth of a triangular potential well that might be generated at heterojunction 105h and reduce a number of electrons that might accumulate in the well to create a 2DEG at the heterojunction. Potential modifying layer 108 therefore results in the current channel in GaN layer 105 being normally depopulated of electrons and non-conducting, and FET 20 therefore normally OFF.

In an embodiment of the invention, active layer set 122 comprises an $In_xGa_{1-x}N$ layer 104 formed on layer 103 that functions as a barrier layer to improve confinement of electrons to layer 105 when, as discussed below with reference to FIGS. 2A and 2B, FET 20 is controlled to be ON and current flows in layer 105. Concentration "x" in layer 104 has a value between about 0.05 and about 0.1 and the layer has thickness between about 1 nm and about 2 nm. Optionally, active layer set 122 comprises a GaN transition layer 107 located between layers 106 and 108. Layer 107 operates to enhance lattice matching between layer 106 and layer 108 and layers above layer 108.

In an embodiment of the invention, GaN channel layer 105 has thickness between about 5 nm and about 20 nm. Optionally, $In_yAl_zGa_{1-y-z}N$ electron supply layer 106 has thickness between about 8 nm and about 12 nm and has a graded Al mole fraction, which decreases from a about 0.35 at heterojunction 105h with layer 105 to about 0.05 at a heterojunction 106h between layers 106 and 107. In an embodiment of the invention, to match lattices in channel layer 105 and electron supply layer 106, y is equal to about 0.176 and z is equal to about 4.66y. $In_xGa_{1-x}N$ potential modifying layer 108 has thickness between about 3 nm and 20 nm and x has a value between about 0.08 and about 0.22.

A second GaN channel layer 109 and associated $In_yAl_zGa_{1-y-z}N$ electron supply layer 111 separated by an AlN spacer layer 110 are formed on layer 108. AlN spacer 110 functions to reduce alloy scattering of electrons at a heterojunction 109h and increase electron mobility and density in 2DEGs formed near regions 109G2 and 109G3 of the heterojunction. The 2DEGs are discussed below. Layer 109 has thickness between about 1 nm and about 27 nm. Layer 111 has thickness between about 8 nm and about 13 nm before formation of recess 130 discussed below. AlN spacer layer has thickness between about 0.5 nm and about 3 nm. Optionally, as in the case of layers 105 and 106, to match lattices in GaN channel layer 109 and electron supply layer 111, y is equal to about 0.176 and z is equal to about 4.66y. A GaN cap layer 112 having thickness between about 0.5 nm and about 4 nm protects surface regions of layer 111 under and in vicinities of drain DRN and source SRC from being oxidized.

Source and drain terminals SRC and DRN located on cap layer 112 comprise ohmic contact metal stack deposits that are subjected to an annealing process so that metal in the terminals diffuses into underlying active semiconductor layers to promote formation of an ohmic contact between each terminal and the semiconductor layers.

Metal deposits for conventional ohmic contact terminals are typically formed so that they contact vertical edges of active layers in a mesa of a semiconductor device to which ohmic contact is desired and contact a buffer layer on which the upper epitaxial layers of the mesa is grown. During annealing, diffusion of the metal in the conventional deposits tends to form sharp tipped metallic, "stalactites" that penetrate the buffer layer. Penetration of the stalactites into the buffer layer, and strong electrostatic fields generated by their sharp tips promote leakage currents and tend to damage the buffer and other layers in the mesa.

In accordance with an embodiment of the invention, to prevent formation of metallic stalactites that penetrate to the buffer layer, metallic deposits for source SRC and drain DRN are deposited only on top, GaN cap layer 112 of FET 20 and are prevented from contact with vertical edges of stack 120.

Figure 1B:
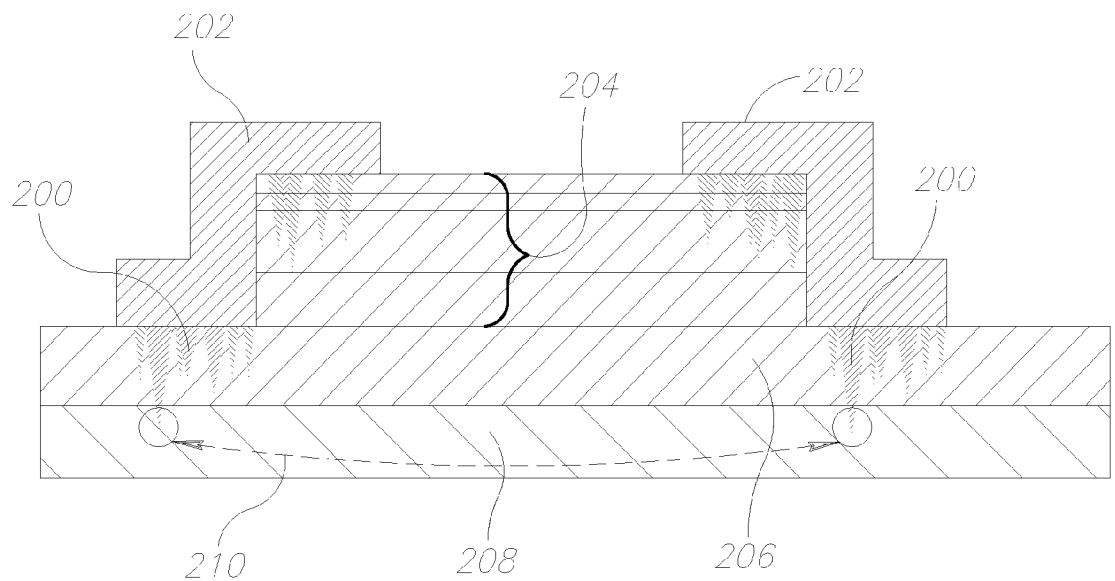
FIG. 1B schematically shows providing a FET with ohmic contact source and drain electrodes in which diffusion of conducting material penetrates to a buffer layer in the FET.

FIG. 1B schematically shows formation of stalactites 200 resulting from a conventional production process of ohmic contact terminals 202 for a mesa 204 of semiconductor layers grown on a buffer layer 206. The stalactites penetrate the buffer layer and generate intense electric fields at their relatively sharp tips and edges, which fields tend to promote leakage currents in the buffer layer and in an underlying substrate layer 208. A leakage current path between sharp points (circled for ease of reference) of the stalactites is schematically indicated by a dashed arrow head line 210.

Figure 1C:
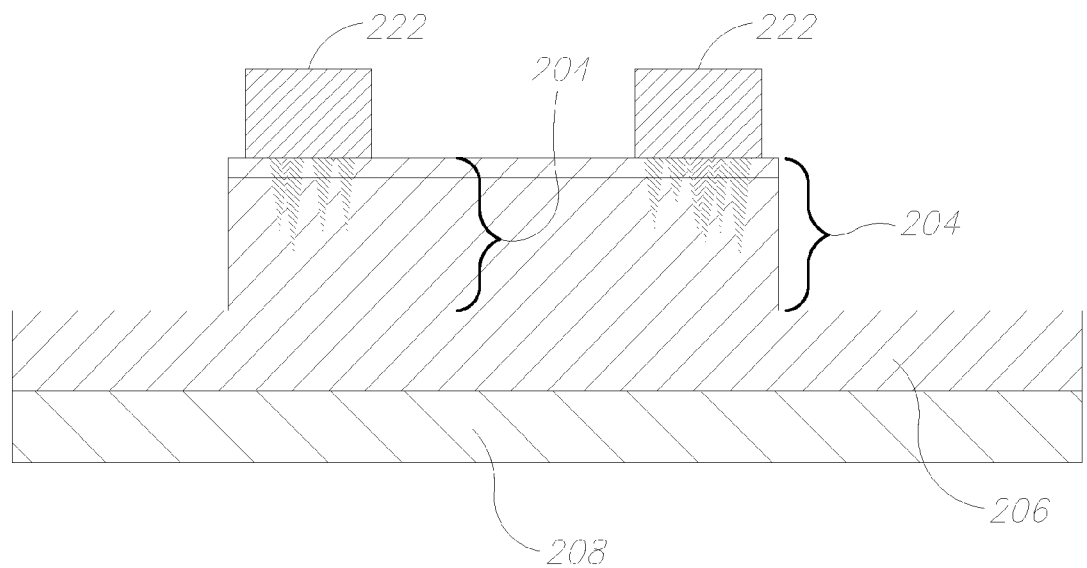
FIG. 1C schematically show providing the FET shown in FIG. 1B with ohmic contact source and drain electrodes in which diffusion of conducting material is prevented from penetrating to the buffer layer in the FET, in accordance with an embodiment of the invention.
Figure 1D:
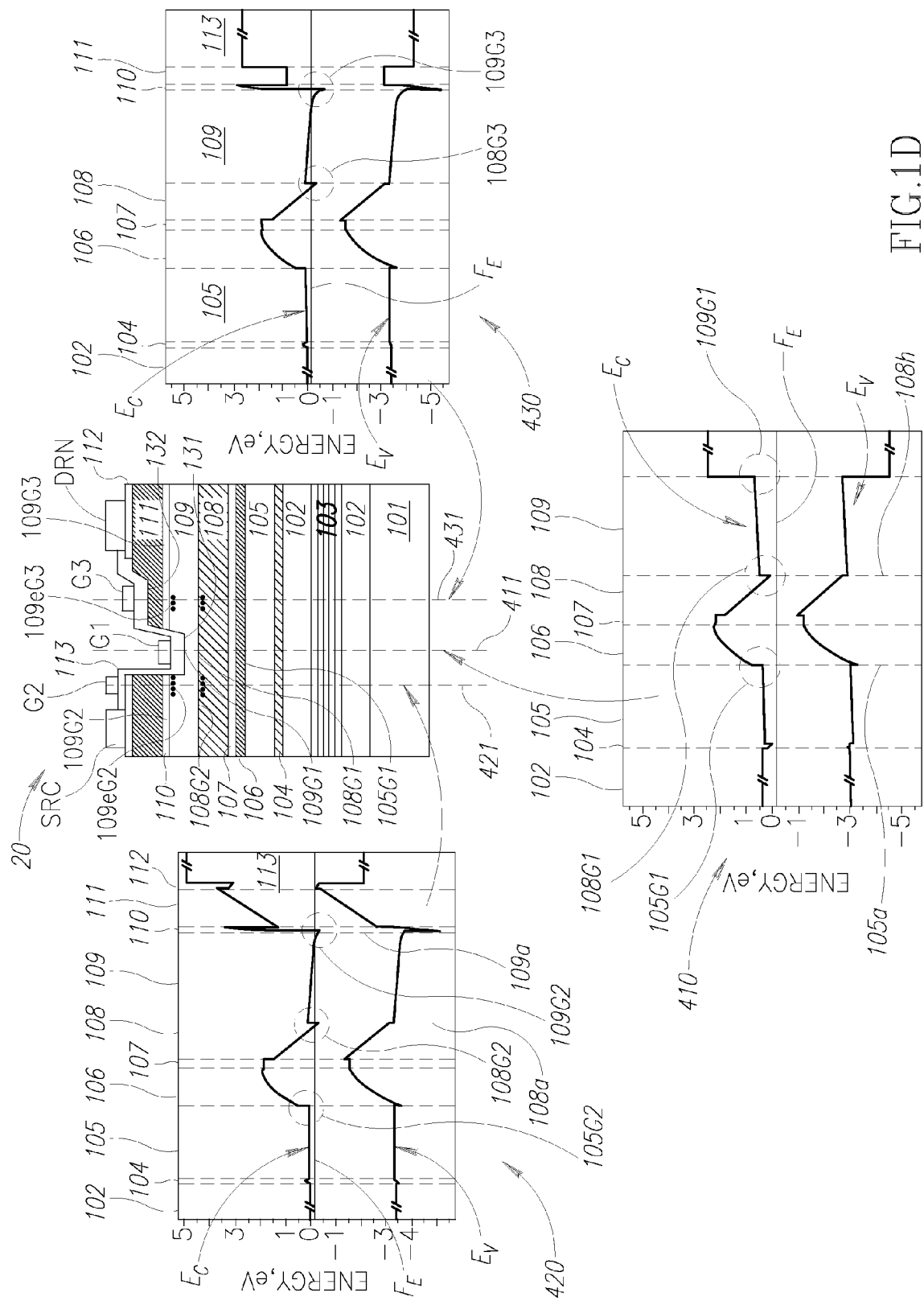
FIG. 1D shows band diagrams for regions of the FET shown in FIG. 1A for the OFF state, in accordance with an embodiment of the invention.

FIG. 1C schematically shows formation of stalactites 220 in a production process of an ohmic contact terminal 222 for the same mesa 204 of semiconductor layers shown in FIG. 1B, in accordance with an embodiment of the invention. Because metal for terminals 222 is deposited only on a top layer 205 of mesa 204, and not deposited on edges of layers in the mesa or on buffer layer 206, the stalactites do not penetrate the buffer layer.

In an embodiment of the invention, FET 20 is formed having a terraced recess 130, shown in FIG. 1A comprising lower and upper terraces 131 and 132 located respectively in $In_yAl_zGa_{1-y-z}$N layer 111 and GaN layer 109. A layer 113 of insulting material, such as $Si_3N_4$, $Al_2O_3$, or AlN, covers surfaces of recess 130 and surface regions of layer 111 along edges of the recess. Gate G1 is located on insulating layer 113 that covers lower terrace 131 and gate G3 is located on a portion of insulating layer 113 that covers upper terrace 132. Gate G2 is located adjacent source SRC on a portion of insulating layer 113 that covers $In_yAl_zGa_{1-y-z}$N layer 111.

In a region of FET 20 under gate G2, GaN channel layer 109, AlN spacer layer 110 and $In_yAl_zGa_{1-y-z}$N electron supply layer 111 are "intact", that is their thickness, has not been altered by recess 130. Energy differences between the conduction and valence bands in GaN channel layer 109 and the conduction and valence bands respectively in $In_yAl_zGa_{1-y-z}$N layer 111, and electrostatic electric fields generated by polarization in the layers produce a triangular potential well in the GaN layer near a heterojunction region 109G2 and populate the potential well with a 2DEG. In FIG. 1A electrons in the 2DEG are schematically represented by filled circles 109eG2, which numeral is also used to refer to the 2DEG. In an embodiment of the invention 2DEG 109eG2 has an electron concentration equal to or greater than about $10^{13}$ electrons per $cm^2$. The potential well is schematically shown in energy band diagrams in FIG. 1D discussed below.

In a region of FET 20 under gate G3, GaN channel layer 109 and AlN spacer layer 110 are intact, but $In_yAl_zGa_{1-y-z}$N electron supply layer 111 is thinned down under gate G3 to between about 20% to about 70% of its width under gate G2 by formation of recess 130. As in heterojunction region 109G2, energy differences between conduction and valence bands in layer 109 and conduction and valence bands in layer 111 and electrostatic fields in the layers populate a 2DEG at a region 109G3 heterojunction of heterojunction 109h between layers 109 and 110. Electrons in the 2DEG, and the 2DEG, are schematically represented by filled circles 109eG3. However, because the region of electron supply layer 111 under gate G3 is thinner than the region of electron supply layer 111 under G2, 2DEG 109eG3 under G3 has a smaller accumulation of electrons than 2DEG 109eG2 under gate G2. To schematically indicate the relative sizes of the 2DEGs under gates G2 and G3, a number of electrons 109eG3 shown in layer 109 under gate G3 is smaller than a number of electrons 109eG2 shown in layer 109 under gate G2. In an embodiment of the invention 2DEG 109eG3 has an electron concentration equal to or greater than about $3 \times 10^{12}$ electrons per $cm^2$.

Recess 130 has resulted in complete removal of electron supply layer 111 and spacer layer 110 under gate G1. Therefore, in the absence of voltage on gate G1, a 2DEG does not exist under gate G1, and as a result no continuous conductive path capable of carrying current between source SRC and drain DRN exists in layer 109. Nor does a 2DEG exist under gate G1 in any layers of active layer set 122 and therefore the active layer set does not provide a continuous conductive current path between source SRC and drain DRN in the absence of voltage on gate G1.

As discussed above, active layer set 122 is absent any 2DEGs because of the functioning, in accordance with an embodiment of the invention, of potential modifying layer 108, in preventing generation of a 2DEG in GaN channel layer 105. Potential wells (schematically shown in FIG. 1D) capable of accumulating 2DEG electrons exist in layer 108 along heterojunction regions 108G1, 108G2 and 108G3 between layers 108 and 109, under gates G1, G2 and G3 respectively. Potential wells under gates G2 and G3 are populated with electrons 108eG2 under gate G2 and electrons 108eG3 under gate G3. However, the potential well in the current band edge under gate G1, as shown in FIG. 1D has energy substantially greater than the Fermi energy and therefore is substantially without electrons. Layer 108 therefore does not provide a conducting current path between source SRC and drain DRN in the absence of voltage applied to gate G1.

As a result, as shown for FET 20 in FIG. 1A, in the absence of appropriate voltages on gate G1, and gates G2 and G3, continuous conduction paths in the FET between source SRC and drain DRN are substantially non-existent, and the FET is OFF.

FIG. 1D shows a schematic cross section of FET 20 and graphs 410, 420 and 430 that show energy band diagrams associated with regions of the FET under gates G1, G2 and G3 respectively. Dashed lines 411, 421 and 431 indicate regions of FET under gates G1, G2, and G3 characterized by the band diagrams in graphs 410, 420 and 430 respectively. Regions in the graphs corresponding to semiconductor layers shown in FIG. 1A are labeled with the same numerals with which they are labeled in FIG. 1A. Vertical dashed lines in the graphs indicate heterojunctions between the layers. Regions of the heterojunctions in the graphs associated with regions of heterojunctions in FIG. 1A are indicated by dashed circles labeled with the numerals with which the regions of the heterojunctions are labeled in FIG. 1A. Potential energy is shown along an ordinate of each graph and a line $E_F$ indicates the Fermi energy level for each band diagram. Lines $E_C$ and $E_V$ in a graph delineate conduction and valence band edges respectively for the region of FET 20 associated with the graph.

By way of a numerical example, the energy bands shown in graphs 410, 420 and 430 are determined for thickness of layers 102, 103, . . . to 108 equal respectively to 1800 nm, 150 nm, 1 nm, 10 nm, 10 nm, 2.6 nm, and 10 nm respectively. Under gates G2 and G3 layer 109 is assumed to have thickness of 25 nm and under gate G1 thickness of 5 nm. Under gate G2, layers 110, 111 and 112 are assumed to have thickness of 1 nm, 10.7 nm and 1.5 nm respectively. Under gate G3 layers 110 and 111 have thickness of 1 nm and 5 nm respectively. Dielectric layer 113 has thickness equal to 20 nm.

In graph 410, which shows conduction and valence band edges $E_C$ and $E_V$ for the region of FET 20 under gate G1, conduction band edge $E_C$ is displaced above the Fermi energy $E_F$. As a result, the conduction band, and a potential well in a region indicated by a dashed circle 108G1, of the heterojunction between layers 108 and 109 are relatively empty of electrons. It is noted that in regions of heterojunctions layers 105 and 106 and between layers 109 and 110 indicated by dashed circles 105G1 and 109G1 respectively in graph 410, depth of lower terrace 131 (FIG. 1), and differences in conduction band and valence band energy levels of layers 105-109 substantially eliminate potential wells capable of accumulating 2DEG electrons. The absence of any concentration of 2DEG electrons under gate G1 renders FET 20 OFF when no voltages are applied to gate G1.

Under G2, as shown in graph 420 on the other hand, electron potential wells exist in regions of heterojunctions between layers 108 and 109 and between layers 109 and 110 indicated respectively by dashed circles 108G2 and 109G2 in the graph, and portions of the potential wells are located below the Fermi energy $E_F$. Similarly, electron potential wells under gate G3 exist in regions of heterojunctions between layers 108 and 109 and between layers 109 and 110 indicated by dashed circles 108G3 and 109G3 respectively in graph 430, and portions of these potential wells are located below the Fermi level $E_F$. As a result, the potential wells in the regions indicated by the dashed circles are at least partially filled with 2DEG electrons.

The 2DEGs under gates G2, and electrons in the potential wells that populate the 2DEGs are, as noted above in the discussion of FIG. 1A, schematically represented respectively by filled circles 109eG2 and 108eG2. Similarly, the 2DEGs under gates G3, and electrons in the potential wells that populate the 2DEGs are, as noted above in the discussion of FIG. 1A, schematically represented respectively by filled circles 109eG2 and 108eG2.

The regions under gates G2 and G3 are, as noted above, referred to as access regions and the 2DEGs 109eG2, 109eG2, 108eG3, and 108eG3 in the access regions provide sources of electrons for rapidly filling electron channels under gate G1 and establishing continuous, low resistance conduction current paths between source SRC and drain DRN when FET 20 is turned ON.

Voltages applied to gates G1, G2, and G3 operate to generate electric fields in FET 20 that change current paths in the FET between source SRC and drain DRN from substantially non-conducting, high resistance current paths, to conducting, low resistance current paths and turn the FET ON, in accordance with an embodiment of the invention. The plurality of gates allows voltages applied to the gates to be configured to shape fields and electrostatic potential in the FET that provide advantageous characteristics for operation of the FET. For example, voltages applied to the gates may be used to moderate potentially damaging large voltage and/or current transients in the FET during transition between ON and OFF states.

It is noted that whereas FET 20 comprises three gates, practice of the invention is not limited to three gates. For example, a FET transistor may have four or more gates located between a source and a drain to generate a desired shape electrostatic potential in the FET.

In an embodiment of the invention, voltage applied to a gate closer to source SRC to turn FET 20 ON is larger than voltage applied to a gate farther from the source. The decreasing voltage regime moderates large swings in voltage and/or current during transition periods between ON and OFF states of FET 20. In symbols, if voltages applied to gates G1, G2, and G3 to turn FET 20 ON are represented by V1, V2, and V3 respectively, then the voltages may have a relationship V2>V1>V3.

For a configuration of a normally OFF FET, such as FET 20, in accordance with an embodiment of the invention, voltages V1 and V2 applied to gates G1 and G2 to turn ON the FET are positive. In an embodiment of the invention, V1 is greater than or equal to about 2.0 volts. Optionally V1 is greater than or equal to about 2.5 volts. In an embodiment of the invention V2 is greater than or equal to about 2.5 volts. Optionally, V2 is greater than or equal to about 3 volts. In an embodiment of the invention V3 is less than or equal to about 0 volts. Optionally V3 is less than or equal to about −1 volt.

FIG. 2A schematically shows a perspective view of FET 20 when the FET is turned ON by voltages V1, V2, and V3. FIG. 2B schematically shows a cross section view of FET 20 in the ON state shown in FIG. 2A. FIG. 2B also shows graphs 520, 530 of energy bands $E_C$ and $E_V$ for access regions of FET 20 under gates G2 and G3 respectively, and a graph 510 of energy bands $E_C$ and $E_V$ for a region of the FET under gate G1. Regions of heterojunctions distinguished by labeled dashed circles in the graphs shown in FIG. 1D are distinguished by dashed circles respectively labeled by the same numerals in the graphs of FIG. 2B.

By way of a numerical example, the energy bands in graphs 510, 520 and 530 are determined for thickness of layers which are the same as those used to determine the energy band shown in graphs 410, 420, and 430, and V1, V2, and V3, equal respectively to about 2.5 volts, 3 volts, and −1 volt.

Figure 2B:
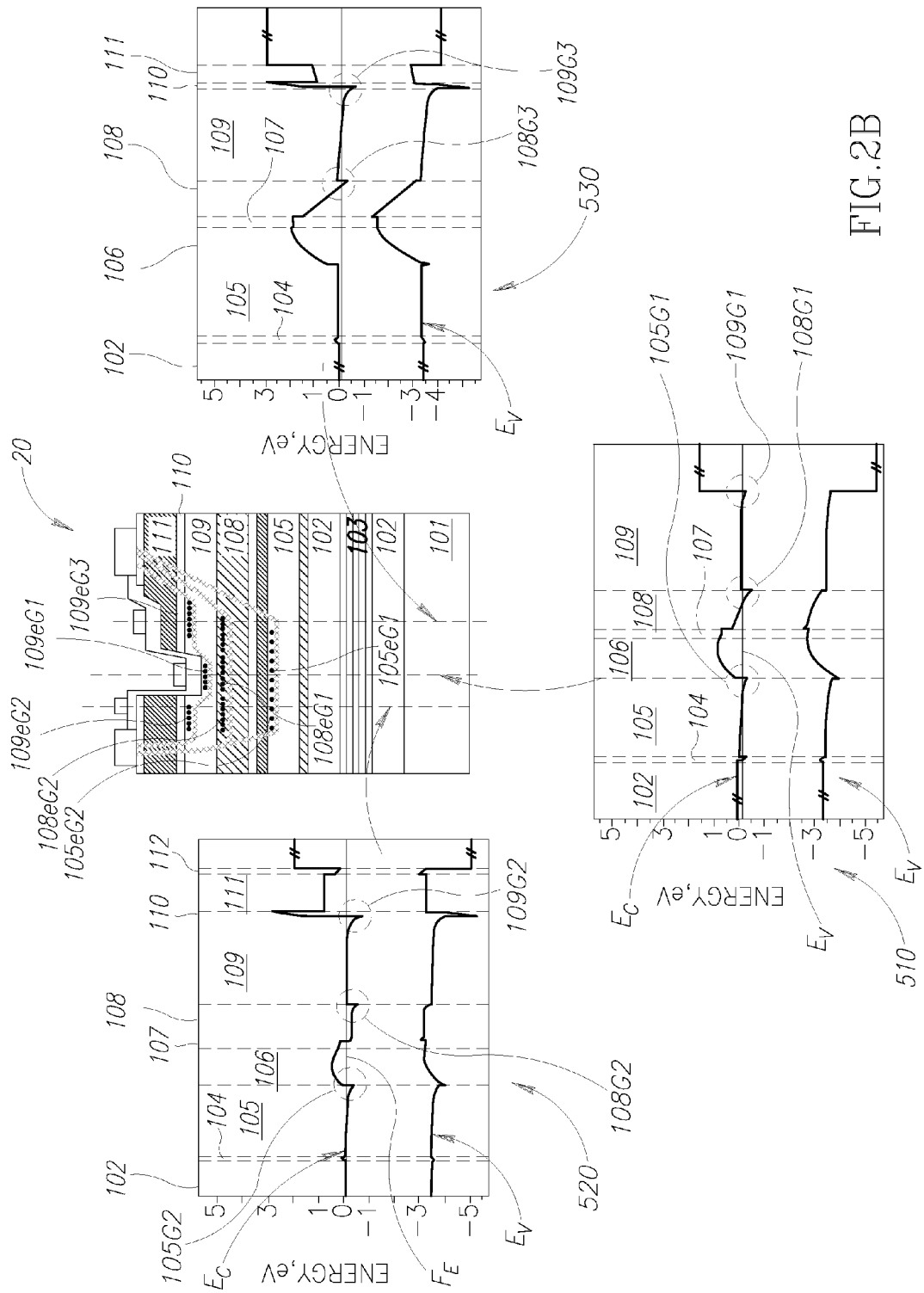
FIG. 2B schematically shows energy band diagrams for the FET in the ON state shown in FIG. 2A, in accordance with an embodiment of the invention.

Positive voltage V1 applied to gate G1 reconfigures the conduction band edge $E_C$ under the gate shown in graph 410 in FIG. 1D to create potential wells in channel layers 109 and 105 in regions 105G1 and 109G1 of heterojunctions between layers 105 and 106 and between layers 109 and 110 shown in graph 510 of FIG. 2B. V1 also lowers conduction band $E_C$ so that the newly created potential wells in regions 109G1 and 105G1 and the potential well shown in graph 410 in FIG. 1D in region 108G1 are at least partially below the Fermi energy $E_F$. The wells are therefore at least partially filled with electrons that populate 2DEGs in layers 105, 108 and 109 respectively. The 2DEGs and the electrons that fill them are represented by filled circles 105$e$G1, 108$e$G1 and 109$e$G1 in FIG. 2A and in the cross section of FET 20 shown in FIG. 2B.

Voltage V2 applied to gate G2 lowers conduction band $E_C$ relative to its position in the OFF state of FET 20 shown in graph 420 of FIG. 1D so that as shown in graph 520 of FIG. 2B, potential wells in regions 109G2 and 108G2 of heterojunction between layer 109 and 110 and between layers 108 and 109 respectively are below the Fermi level. Voltage V2 also creates, or enhances, a potential well in region 105G2 under gate G2, which as shown in graph 520 of FIG. 2B is also below the Fermi level. The potential wells in layers 105, 108 and 109 are filled with 2DEGs, schematically represented by filled circles 105$e$G2, 108$e$G2 and 109$e$G2 respectively, in FET 20 shown in FIG. 2A and in the cross section of the FET in FIG. 2B. Negative voltage V3, operates to moderate fields and potential drops in the access region under gate G3 and prevent punch through to the drain.

As a result of the creation of 2DEGs under gate G1 in layers 105, 108 and 109 and the enhancement of 2DEGs in the access region under gate G2 in layers 108 and 109 and generation of 2DEGs in layer 105, a plurality of parallel 2DEG conducting current paths is provided between source SRC and drain DRN. The parallel current paths, shown as shaded regions 500 in layers 105, 106 and 109, "combine" to provide an enhanced 2DEG current path between the source and the drain characterized by a resistance lower than that of any of the component current paths. The combined current paths enable FET 20, when ON, to support a relatively large current between source SRC and drain DRN for a relatively small voltage drop between the source and drain and therefore a relatively moderate heat load.

In an embodiment of the invention FET 20 is characterized by an ON resistance between source SRC and drain DRN that is less than or equal to about 75 milliohms for a source SRC to drain DRN current of about 100 amps and voltage between the source and drain equal to about 1700 volts. Optionally the ON resistance is less than or equal to about 50 milliohms.

Relatively large quantities of hot electrons are generated in current channels between the source and drain of a FET when it is ON and conducting relatively large currents. A portion of the hot electrons propagate towards the FET drain and become trapped in surface states at an interface between a semiconductor channel layer carrying the current and a dielectric layer, such as dielectric layer 113 in FET 20, under the gate and drain access area and/or in traps in the dielectric layer and/or in a passivation layer, such as layer 112, under the drain. The trapped electrons generally damage the FET and degrade its operating parameters.

Figure 3A:
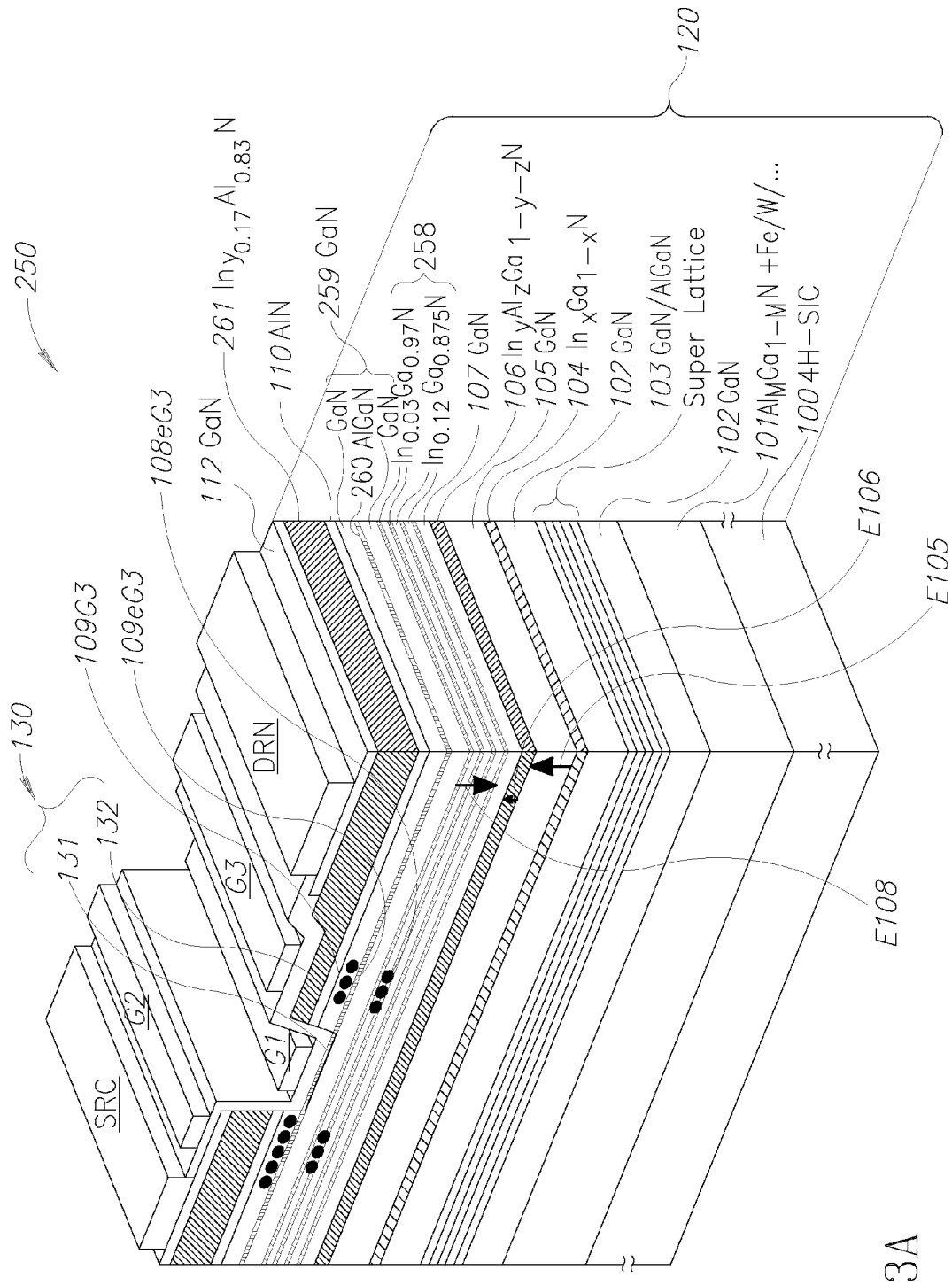
FIG. 3A schematically shows a perspective view of a FET that is a variation of the FET shown in FIG. 1A, in accordance with an embodiment of the invention.

FIG. 3A schematically shows a perspective view of a GaN FET transistor 250, in accordance with an embodiment of the invention that is a variation of FET transistor 20. GaN transistor 250 is shown in an OFF state.

Layers in GaN transistor 250 are optionally the same as layers in GaN transistor 20 except for layer 258 which replaces layer 108 in transistor 20 and is formed as a superlattice that includes alternating layers of $In_xGa_{1-x}N$ and $In_yGa_{1-y}N$ where $x \neq y$. The layers have thickness $t_x$ and $t_y$ respectively. Whereas the electrostatic field in layer 108 is a relatively smooth function equal to the slope of the electron conduction band edge $E_C$ in layer 108 shown in the energy band diagrams in FIG. 1D, $E_C$ in layer 258 resembles a stepped function having discontinuities at interfaces between the $In_xGa_{1-x}N$ and $In_yGa_{1-y}N$ superlattice layers. However, layer 258 functions similarly to layer 108 as a potential modifying layer, and has an electrostatic field in a direction opposite to the electrostatic field E106 in electron supply layer 106.

Figure 3B:
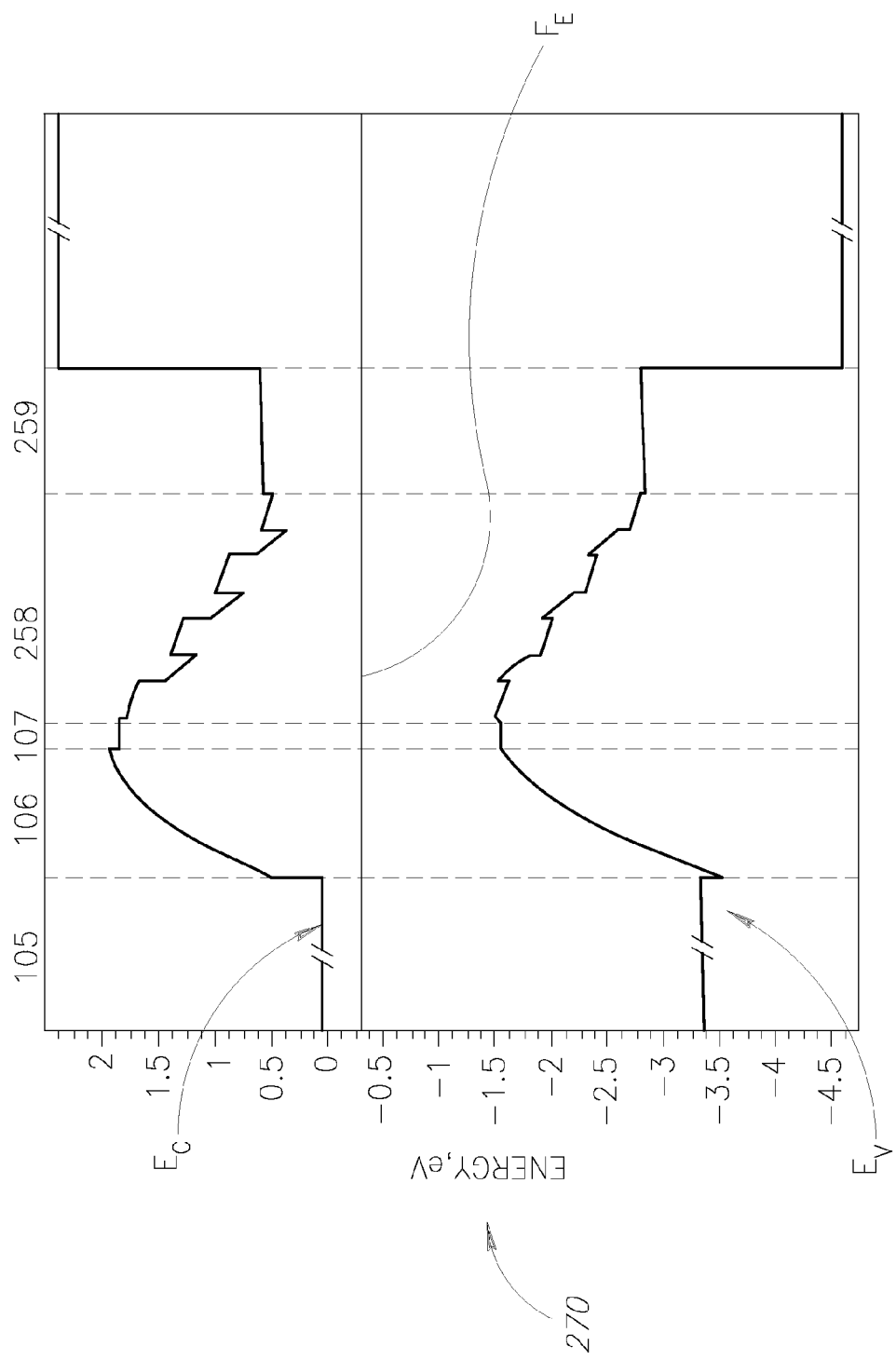
FIG. 3B shows a portion of an energy band diagram for the FET shown in FIG. 3A, in accordance with an embodiment of the invention.

In an embodiment of the invention x is equal to about 0.03 and y is equal to about 0.12, with thickness $t_x$ and $t_y$ equal to about 2 nm and about 3 nm respectively. FIG. 3B shows a graph 270 of the electron conduction band edge $E_C$ in layer 258 and adjacent layers for values of x, y, $t_x$, and $t_y$ given in the preceding sentence. A superlattice layer such as layer 258 can be advantageous in a production process used to produce transistor 250 by contributing to reducing concentrations of defects and impurities in layers formed above layer 258.

In an embodiment of the invention, GaN channel layer 109 in transistor 250 is replaced by a channel layer 259 formed from GaN but having in addition, as shown in FIG. 3A, an etch stop layer 260 that limits etching of terrace 131 in recess 130 to a desired depth in layer 259.

In an embodiment of the invention, electron supply layer 111 formed from $In_xAl_yGa_{1-x-y}N$ in transistor 20 is replaced by an electron supply layer formed from $In_xAl_{1-x}N$, such as a layer 261 formed from $In_{0.17}Al_{0.83}N$ to lattice match with GaN layers in transistor 250. A layer formed from $In_xAl_{1-x}N$ may generally be produced at temperatures substantially less, often by as much as a few hundred degrees, than temperatures at which a layer of $In_xAl_yGa_{1-x-y}N$ may be produced. Production of a given layer in a semiconductor stack at reduced temperatures generates less heat stress in, and thereby less potential damage to, layers in the stack produced before production of the given layer.

Figure 3C:
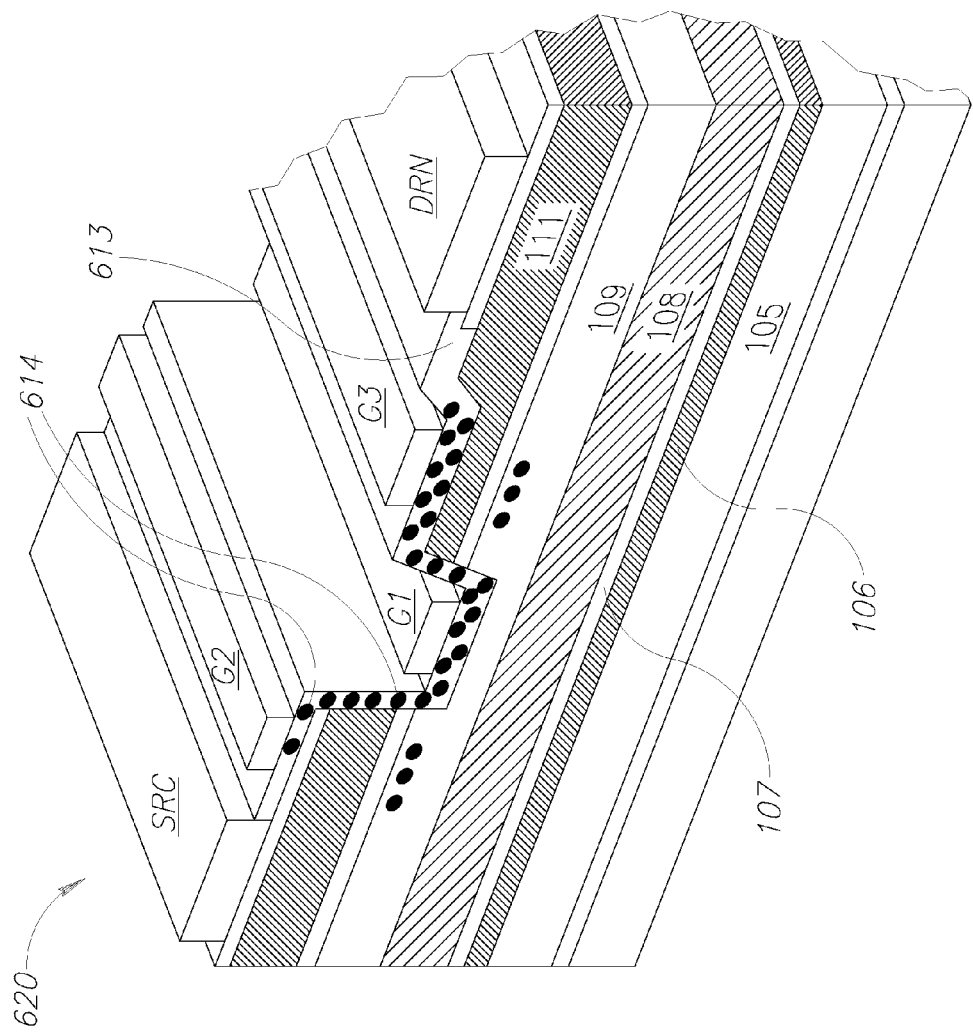
FIG. 3C schematically shows a FET similar to that shown in FIGS. 1A and 2A and comprising a negatively charged dielectric layer under gates of the FET, in accordance with an embodiment of the invention.

A FET, such as a FET similar to FET 20, in accordance with an embodiment of the invention may have a dielectric layer under its gates charged negatively optionally by embedding electrons in the layer by plasma enhanced chemical vapor deposition or atomic layer deposition. The negatively charge dielectric provides a repulsive electric field that operates as a barrier to hot electrons and reduces a probability of hot electrons being trapped at sensitive heterojunction surfaces. FIG. 3C schematically shows a portion of a FET 620 similar to FET 20 but having a dielectric layer 613 charged with electrons 614 that operate as a barrier to hot electrons, in accordance with an embodiment of the invention.

In an embodiment of the invention, the dielectric layer under the gates comprises component layers of $Al_2O_3$ interleaved with component layers of $HfO_2$. Optionally, the interleaved layers are deposited one on top of the other by atomic layer deposition (ALD) until the dielectric layer has thickness in a range of about 5 nm to about 100 nm. Optionally, the dielectric layer is produced by initially forming some $Al_2O_3$ and $HfO_2$ layers using thermal ALD and subsequently forming $Al_2O_3$ and $HfO_2$ layers using plasma enhanced ALD. The combination of thermal ALD and plasma enhanced ALD processing operates to reduce potential plasma damage to the under-gate region of the FET and to provide low hysteresis CV and IV characteristics of the FET. The dielectric comprising $Al_2O_3$ and $HfO_2$ component layers can provide a higher dielectric constant with reduced leakage current than a monolithic dielectric layer and improve transconductance and current capability of the FET.

Figure 4A:
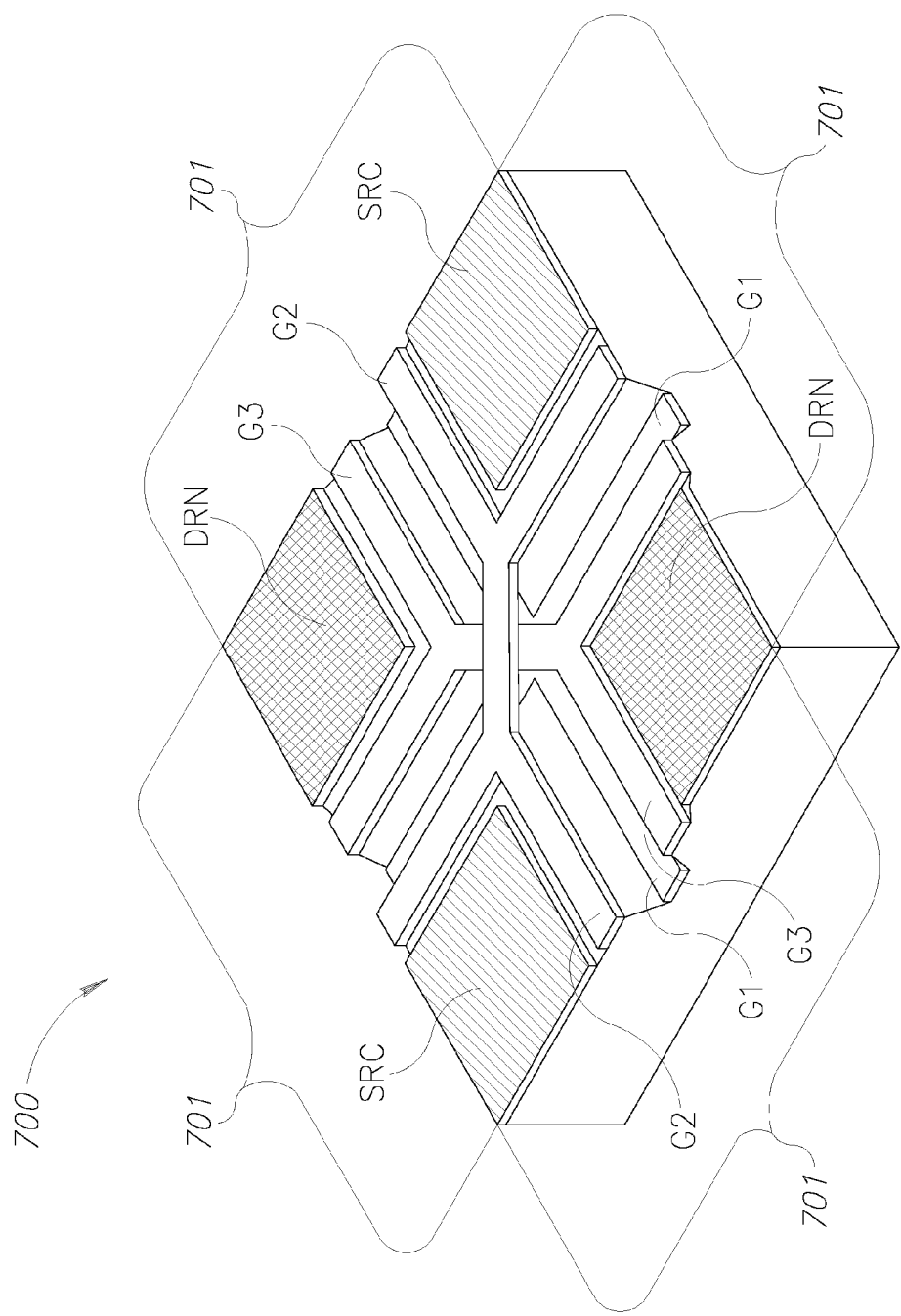
FIGS. 4A and 4B schematically show a monolithic array of FETs similar to that shown in FIG. 1A configured in a checkerboard pattern, in accordance with an embodiment of the invention.

In an embodiment of the invention, a plurality of FETs, optionally similar to FET 20, are monolithically formed on a suitable substrate in a checkerboard array with each source, SRC of a FET adjacent at least two drains DRNs of other FETs in the array. FIG. 4A schematically shows a monolithically formed array 700 of FETs 701 for which the FETS are fabricated so that their sources SRC and drains DRNs form a checker board pattern. Optionally FETs 701 are similar to FET 20 and each FET 701 comprises three gates G1, G2 and G3. For convenience of presentation, semiconductor layers in the FETs under the drains and gates are not shown. Gates G1 for all the FETs, as shown in FIG. 4A, are electrically connected. Similarly, all gates G2 are electrically connected and all gates G3 are electrically connected. Electrical connections between the gates are optionally made at different levels in array 700 as schematically shown in FIG. 4A.

By growing FETs 701 in a checkerboard array, the gates have relatively large "active" perimeters for controlling 2DEG current channels between sources and drains compared to gates in a conventional array of FETs for which sources are adjacent each other, and a line of adjacent sources is opposite a line of adjacent drains. In general, a checkerboard array of FETs in accordance with an embodiment of the invention doubles the active perimeter of the gates in an array compared to a conventional array comprising the same number of FETs. Since ON resistance of a FET and an array of FETs is substantially proportional to active lengths of the gate perimeters, an array of FETs in accordance with an embodiment of the invention may have an ON resistance that is about half that of a conventional array. For a given current, the reduced ON resistance of a checkerboard array in accordance with an embodiment of the invention results in a substantially reduced heat load for the array compared to a conventional array. The checkerboard configuration also tends to moderate hot spots in the FET and foster a temperature distribution in the FET that is more uniform than temperature distributions in conventional arrays.

Figure 4B:
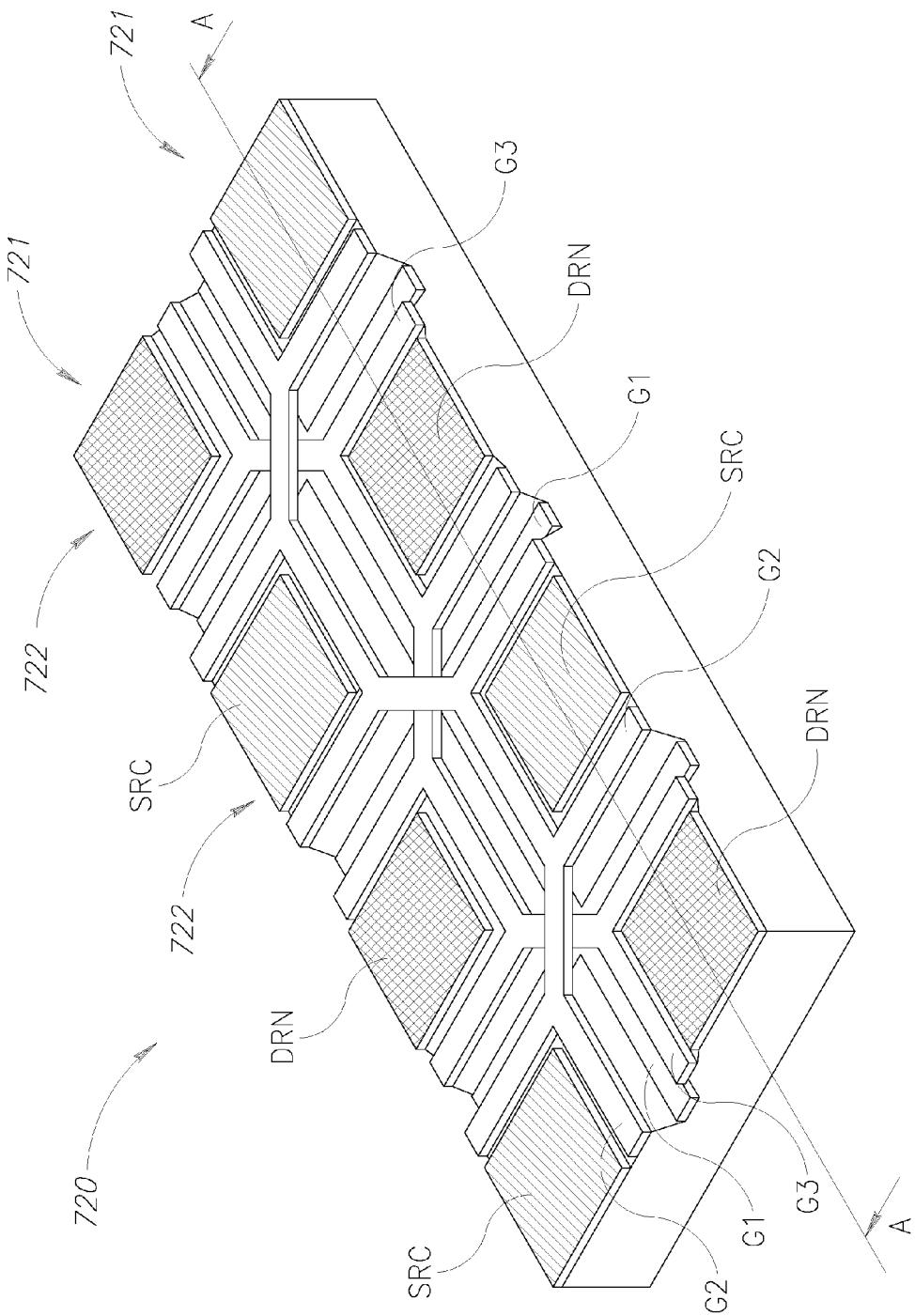

A checkerboard array, in accordance with an embodiment of the invention, is of course not limited to an array having two sources and two drains. For example, FIG. 4B schematically shows a checkerboard array 720 of FETs optionally similar to FET 20 (FIG. 1A) larger than array 700, in accordance with an embodiment of the invention. It is noted that whereas array 720 has a rectangular shape and comprises two rows 721 and four columns 722 of "interleaved" sources SRC and drains DRN, an array may have any number of rows and columns. For example, a checkerboard array of FETs in accordance with an embodiment of the invention may have a square shape and comprise a same number of rows and columns. In an embodiment of the invention a checkerboard FET array comprises 36 rows and 36 columns of FETs similar to FET 20 (FIG. 1A) and may support 50 A of current.

Figure 4C:
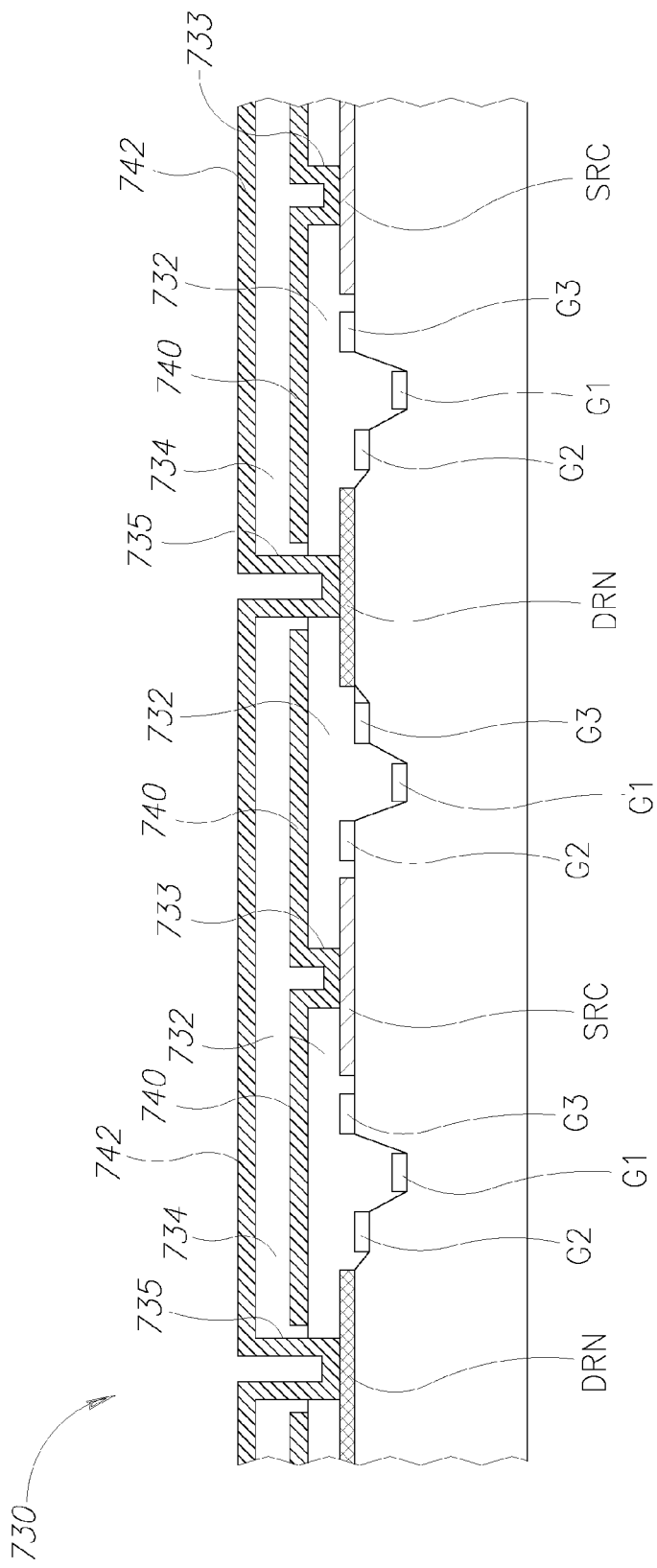
FIG. 4C schematically shows a cross section of a portion of the FET array shown in FIG. 4B having sources electrically connected by a metal pad and drains connected by a different metal pad electrically isolated from the source pad, in accordance with an embodiment of the invention.

FIG. 4C shows a schematic cross section in a plane indicated by line AA of checkerboard array 720 shown in FIG. 4B that illustrates providing ohmic contacts to sources SRC and drains DRN of the array, in accordance with an embodiment of the invention. Ohmic contacts to sources SRC are optionally provided by a layer of metal 740 deposited over a layer of insulating material such as $Si_3N_4$, $AL_2O_3$, or AlN deposited to cover sources SRC, drains DRN and gates G1, G2, and G3. Metal layer 740 is also referred to as source pad 740. Electrical contacts between metal layer 740 and the various sources SRC are made by portions of metal layer 740 deposited in vias 733. An insulating layer 734 electrically isolates conducting layer 740 from a layer of metal 742, which provides ohmic contacts to drains DRN. Electrical contacts between metal layer 742 and the various sources SRC are made by portions of metal layer 740 that are deposited in vias 735. Metal in vias 735 are isolated from metal layer 74 by regions of insulating layer 734 and 732. Metal layer 742 is also referred to as drain pad 742.

Figure 4D:
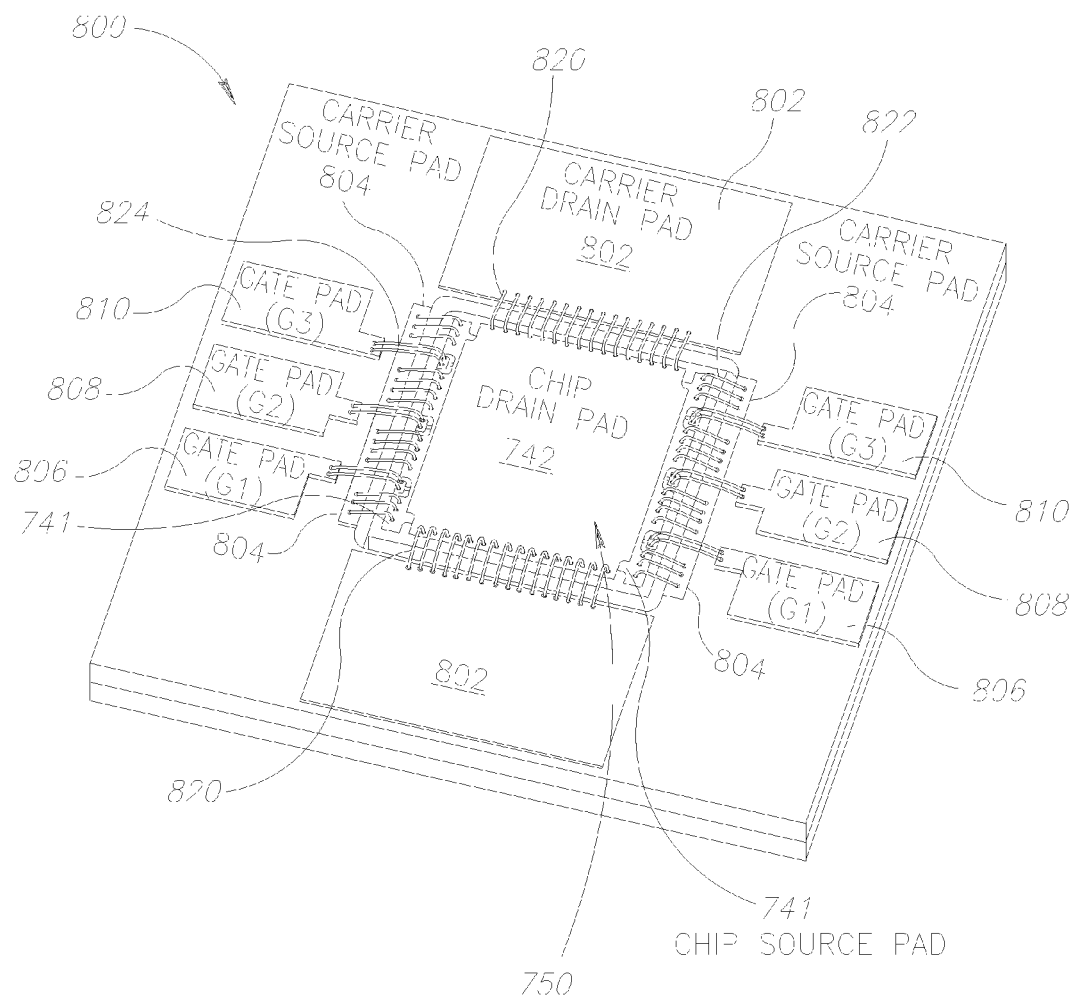
FIG. 4D schematically shows a chip comprising a checkerboard array of FET and mounted to a chip carrier, in accordance with an embodiment of the invention.

FIG. 4D schematically shows a FET checkerboard chip 750 comprising an optionally square checkerboard array of FETs mounted and electrically connected to a chip carrier 800 that provides electrical contacts for connecting chip 750 to a PCB, in accordance with an embodiment of the invention. Chip drain pad 742 that electrically connects, optionally as shown in FIG. 4C, drains DRN of FET checkerboard chip 750 may be connected to two carrier drain pads 802 comprised in chip carrier 800. Carrier drain pads 802 optionally lie along opposite edges of chip 750, and each carrier drain pad 802 is connected to chip drain pad 742 by a plurality of equally spaced, optionally Cu, Al, or Au, wire bonds 820 that are ultrasonically bonded to the chip and carrier drain pads. Chip source pad 741 (FIG. 4C) that connects all sources SRC in FET checkerboard chip 750 is connected, optionally, by ball bonded Al wire bonds 822 to carrier source pads 804 located adjacent opposite edges of chip 750, which are perpendicular to the edges of the chip adjacent carrier drain pads 802. Gates G1, G2 and G3 of are electrically connected by wire bonds 824 to carrier gate pads 806, 808 and 810 respectively that are adjacent the same edges of chip 750 that are adjacent carrier source pads 804.

Figure 5:
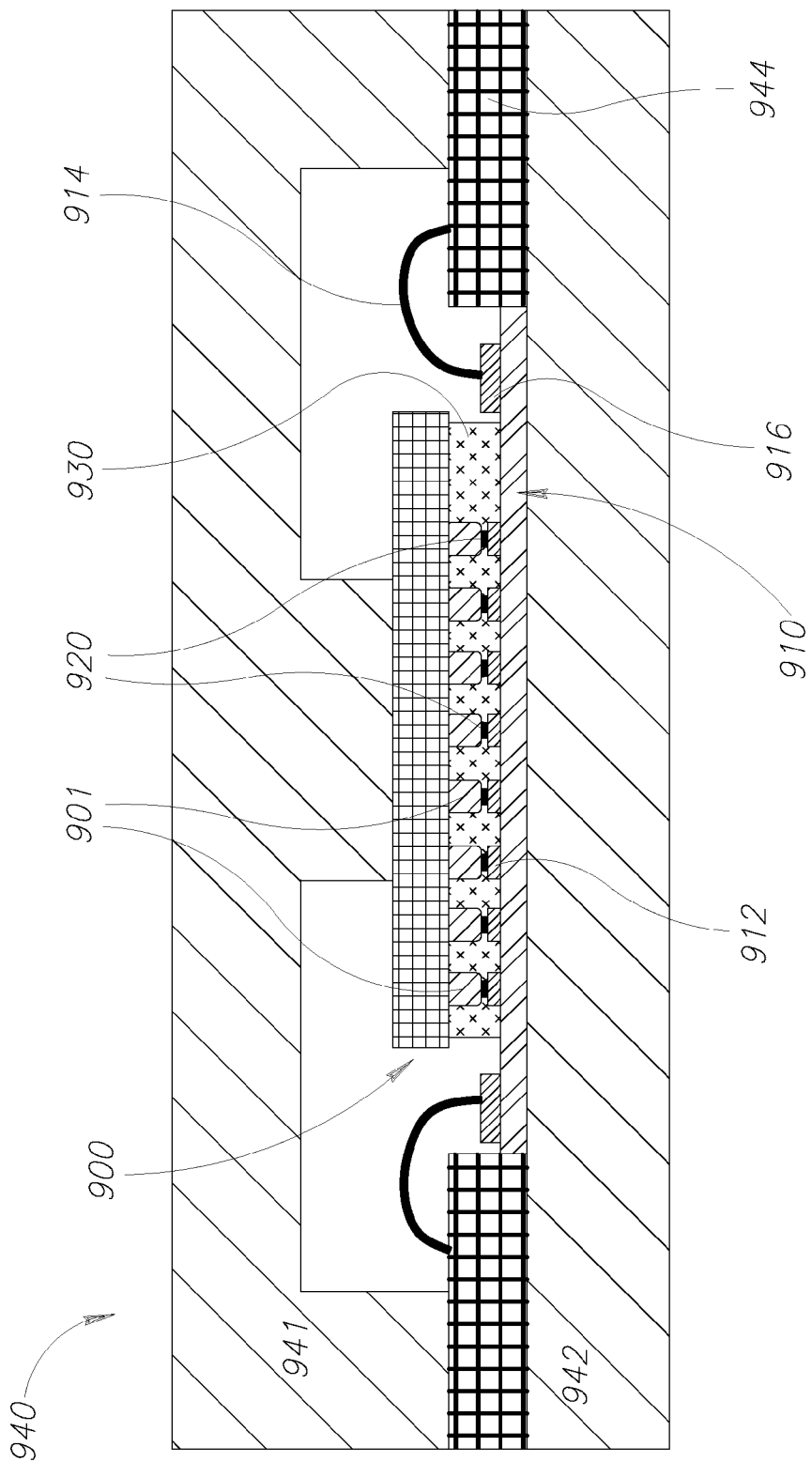
FIG. 5 schematically shows a cross section of an array of FETs housed in a heat dissipating housing in accordance with an embodiment of the invention.

FIG. 5 schematically shows a cross section of a checkerboard FET chip 900 housed in a heat sink housing 940 comprising top and bottom heat sinks 941 and 942, in accordance with an embodiment of the invention.

Chip 900 is mounted and electrically connected to a ceramic interconnection substrate 910 that provides electrical contacts for electrically connecting chip 900 to a PCB (not shown). Connection between the chip and interconnection substrate is provided by a ball grid array of solder balls 920 optionally comprising a high temperature solder alloy such as AuSn. The solder balls are optionally formed on contact pads 901 in chip 900 that are electrically connected to gates G1, G2 and G3, and sources SRC and drains DRN (FIGS. 4A, 4B) of the chip. The solder balls are soldered to corresponding homologous contact pads 912 comprised in interconnection substrate 910 to electrically connect the chip to the interconnect substrate. Optionally, the solder balls are first formed on contact pads 912 in substrate 910 and subsequently soldered to pads 901 in chip 900 to electrically connect the chip and the interconnect substrate. In FIG. 5 only contact pads 901 connected to sources SRC and drains DRN in chip 900 are shown. Lacunae between chip 900 and substrate 910 are optionally filled with a dielectric adhesive 930 that provides added mechanical stability to contact between the chip and substrate and improves electrical insulation between the solder balls.

Chip 900 and substrate 910 are sandwiched between upper and lower heat sinks 941 and 942 so that the heat sinks are in good thermal contact with the chip and the substrate. Electrical contact to ceramic interconnect substrate 910 from outside heat sink housing 940 is optionally provided by suitable connectors 944 that are wire bonded by wire bonds 914 to "peripheral" contact pads 916 comprised in the interconnect substrate.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

Descriptions of embodiments of the invention in the present application are provided by way of example and are not intended to limit the scope of the invention. The described embodiments comprise different features, not all of which are required in all embodiments of the invention. Some embodiments utilize only some of the features or possible combinations of the features. Variations of embodiments of the invention that are described, and embodiments of the invention comprising different combinations of features noted in the described embodiments, will occur to persons of the art. The scope of the invention is limited only by the claims.

The invention claimed is:

1. A normally OFF field effect transistor (FET) comprising:
    a plurality of contiguous nitride semiconductor layers having different composition and heterojunction interfaces between contiguous layers, a Fermi level, and conduction and valence energy bands;
    a source and a drain overlying a top nitride layer of the plurality of nitride layers and having source and drain access regions respectively comprising regions of at least two of the heterojunctions near the source and drain;
    a first gate between the source and drain; and
    a set of nitride layers comprising:
        a first nitride layer having a first band gap;
        a second nitride layer contiguous with the first layer and having a second band gap wider than the first band gap and an electrostatic field having a direction that operates to cause electrons in the second layer to drift towards the heterojunction between the first and second layers;
        a third nitride layer having a third band gap and an electrostatic field in a direction opposite to the electric field in the second layer that operates to prevent accumulation of electrons at the heterojunction between the first and second layers;
    wherein when there is no potential difference between the first gate and a common ground voltage, a two dimensional electron gas (2DEG) is present at a plurality of heterojunctions in each of the source and drain access regions, and substantially no 2DEG is present adjacent any regions of the heterojunctions under the first gate.

2. A FET according to claim 1 wherein the first layer comprises GaN.

3. A FET according to claim 2 wherein the GaN layer has thickness between about 5 nm and about 10 nm.

4. A FET according to claim 1 wherein the second layer comprises $In_yAl_zGa_{1-y-z}N$.

5. A FET according to claim 4 wherein the $In_yAl_zGa_{1-y-z}N$ layer has thickness between about 8 nm and about 11 nm.

6. A FET according to claim 4 wherein the $In_yAl_zGa_{1-y-z}N$ layer has a graded Al mole fraction that decreases with distance from the heterojunction between the first and second layers.

7. A FET according to claim 6 wherein the mole fraction has a value equal to about 0.35 at the heterojunction between the first and second layers.

8. A FET according to claim 6 wherein the mole fraction decreases to a minimum equal to about 0.05.

9. A FET according to claim 1 wherein the first layer has a potential well in the conduction band near the heterojunction between the first and second layers and the field in the third layer raises the potential well above the Fermi level.

10. A FET according to claim 1 wherein the third layer is above, and thereby closer to the source and drain, than the first and second layers.

11. A FET according to claim to claim 1 wherein the third layer comprises $In_xGa_{1-x}N$.

12. A FET according to claim 11 wherein the third layer has thickness between about 3 nm and 10 nm.

13. A FET according to claim 11 wherein x has a value between about 0.08 and about 0.11.

14. A FET according to claim 1 and comprising a fourth nitride layer contiguous with the third layer having a band gap wider than the third band gap.

15. A FET according to claim 14 wherein the fourth layer comprise GaN.

16. A FET according to claim 14 wherein a 2DEG is present in the source access region in a region of the heterojunction between the third and fourth layers.

17. A FET according to claim 14 wherein a 2DEG is present in the drain access region in a region of the heterojunction between the third and fourth layers.

18. A FET according to claim 14 wherein the plurality of layers is formed having a recess which extends into, and has a recess surface in the fourth layer.

19. A FET according to claim 18 wherein the first gate is located on an insulating layer covering the recess surface.

20. A FET according to claim 19 wherein the insulating layer is negatively charged.

* * * * *